United States Patent

Lawrence et al.

[11] Patent Number: 5,948,699
[45] Date of Patent: Sep. 7, 1999

[54] WAFER BACKING INSERT FOR FREE MOUNT SEMICONDUCTOR POLISHING APPARATUS AND PROCESS

[75] Inventors: Edwin Lawrence, Gardiner, N.Y.; Iqbal K. Bansal, Sandy Hook, Conn.

[73] Assignee: SiBond, L.L.C., St. Peters, Mo.

[21] Appl. No.: 08/975,752

[22] Filed: Nov. 21, 1997

[51] Int. Cl.⁶ .................................................. H01L 21/302
[52] U.S. Cl. ........................ 438/692; 438/693; 156/345
[58] Field of Search .................................. 438/692, 691, 438/693; 156/345

[56] References Cited

U.S. PATENT DOCUMENTS

| | | | |
|---|---|---|---|
| 3,708,921 | 1/1973 | Cronkhite et al. | 51/131 |
| 3,841,031 | 10/1974 | Walsh | 51/283 |
| 3,857,123 | 12/1974 | Walsh | 51/131 |
| 4,194,324 | 3/1980 | Bonora et al. | 51/131.5 |
| 4,270,316 | 6/1981 | Krämer et al. | 51/283 R |
| 4,313,284 | 2/1982 | Walsh | 51/131.4 |
| 4,316,757 | 2/1982 | Walsh | 156/286 |
| 4,918,870 | 4/1990 | Torbert et al. | 51/131.3 |
| 4,954,142 | 9/1990 | Car et al. | 51/309 |
| 5,193,316 | 3/1993 | Olmstead | 51/281 SF |
| 5,571,373 | 11/1996 | Krishna et al. | 156/636.1 |
| 5,573,448 | 11/1996 | Nakazima et al. | 451/41 |
| 5,643,406 | 7/1997 | Shimomura et al. | 156/345 |
| 5,709,755 | 1/1998 | Kuno et al. | 438/693 |
| 5,791,975 | 8/1998 | Cesna et al. | 451/63 |
| 5,814,240 | 9/1998 | Yamashita | 438/692 |
| 5,849,636 | 12/1998 | Harada et al. | 438/691 |

FOREIGN PATENT DOCUMENTS 0 770 455 A1  5/1997  European Pat. Off. .
0 777 266 A1  6/1997  European Pat. Off. .

*Primary Examiner*—Benjamin Utech
*Assistant Examiner*—Duy Vu Deo
*Attorney, Agent, or Firm*—Senniger, Powers, Leavitt & Roedel

[57] ABSTRACT

A wafer backing insert for use in a free mount semiconductor polishing apparatus and process is disclosed wherein the wafer backing insert behind the semiconductor substrate has a diameter less than the diameter of the semiconductor substrate being polished to allow the removal of material at the edge of the substrate to be less than the overall average removal of material across the entire substrate. In a preferred embodiment, the process of the present invention utilizing a wafer backing insert having a diameter less than the diameter of the semiconductor substrate being polished is used in combination with a first polishing step utilizing a conventional wafer backing insert to control the resulting thickness and overall TTV of the polished substrate.

22 Claims, 16 Drawing Sheets

| | |
|---|---|
| System | ADE 7200 |
| Wafer Diameter | 150 MM |
| FQA | 144.00 MM |
| Prim. Fid Radius | 68.20 MM |
| TTV | 0.73 UMTR |
| Ave. THK | 685.82 UMTR |
| Min. THK | 685.47 UMTR |
| Max. THK | 686.20 UMTR |
| Cen. THK | 686.20 UMTR |

| System | ADE 7200 |
| --- | --- |
| Wafer Diameter | 150 MM |
| FQA | 144.00 MM |
| Prim. Fid Radius | 68.20 MM |
| TTV | 1.23 UMTR |
| Ave. THK | 683.50 UMTR |
| Min. THK | 682.77 UMTR |
| Max. THK | 684.00 UMTR |
| Cen. THK | 683.83 UMTR |

| | |
|---|---|
| System | ADE 7200 |
| Wafer Diameter | 150 MM |
| FQA | 144.00 MM |
| Prim. Fid Radius | 68.20 MM |
| TTV | 1.07 UMTR |
| Ave. THK | 674.32 UMTR |
| Min. THK | 673.85 UMTR |
| Max. THK | 674.92 UMTR |
| Cen. THK | 674.52 UMTR |

| | |
|---|---|
| System | ADE 7200 |
| Wafer Diameter | 150 MM |
| FQA | 144.00 MM |
| Prim. Fid Radius | 68.20 MM |
| TTV | 0.56 UMTR |
| Ave. THK | 686.00 UMTR |
| Min. THK | 685.76 UMTR |
| Max. THK | 686.33 UMTR |
| Cen. THK | 686.31 UMTR |

| | |
|---|---|
| System | ADE 7200 |
| Wafer Diameter | 150 MM |
| FQA | 144.00 MM |
| Prim. Fid Radius | 68.20 MM |
| TTV | 1.09 UMTR |
| Ave. THK | 687.88 UMTR |
| Min. THK | 687.36 UMTR |
| Max. THK | 688.45 UMTR |
| Cen. THK | 688.41 UMTR |

| System | ADE 7200 |
|---|---|
| Wafer Diameter | 150 MM |
| FQA | 144.00 MM |
| Prim. Fid Radius | 68.20 MM |
| TTV | 0.99 UMTR |
| Ave. THK | 677.39 UMTR |
| Min. THK | 676.76 UMTR |
| Max. THK | 677.75 UMTR |
| Cen. THK | 677.53 UMTR |

| | |
|---|---|
| System | ADE 7200 |
| Wafer Diameter | 150 MM |
| FQA | 144.00 MM |
| Prim. Fid Radius | 68.20 MM |
| TTV | 0.97 UMTR |
| Ave. THK | 677.75 UMTR |
| Min. THK | 677.16 UMTR |
| Max. THK | 678.13 UMTR |
| Cen. THK | 677.91 UMTR |

| | |
|---|---|
| System | ADE 7200 |
| Wafer Diameter | 150 MM |
| FQA | 144.00 MM |
| Prim. Fid Radius | 68.20 MM |
| TTV | 1.49 UMTR |
| Ave. THK | 673.75 UMTR |
| Min. THK | 672.99 UMTR |
| Max. THK | 674.48 UMTR |
| Cen. THK | 674.04 UMTR |

| | |
|---|---|
| System | ADE 7200 |
| Wafer Diameter | 150 MM |
| FQA | 144.00 MM |
| Prim. Fid Radius | 68.20 MM |
| TTV | 1.51 UMTR |
| Ave. THK | 674.15 UMTR |
| Min. THK | 673.70 UMTR |
| Max. THK | 675.21 UMTR |
| Cen. THK | 674.17 UMTR |

WAFER BACKING INSERT FOR FREE MOUNT SEMICONDUCTOR POLISHING APPARATUS AND PROCESS

BACKGROUND OF THE INVENTION

The present invention relates to a wafer backing insert for a free mount semiconductor polishing apparatus and process wherein the wafer backing insert behind the semiconductor substrate has a diameter less than the diameter of the semiconductor substrate being polished to allow the removal rate of material at the edge of the semiconductor substrate to be less than the overall average removal rate across the substrate.

Continuous developments in very-large-scale integration (VLSI) sub-micron integrated circuit (IC) devices have led to the need for extremely flat silicon wafers to enable adequate line width resolution in microlithographic operations. The necessary wafer flatness requires total thickness variation (TTV) on the order of fractions of microns for 150 mm and larger diameter wafers during the polishing processes which produce final wafers. This ability to produce extremely flat silicon wafers has been hampered by the tendency of wafers to exhibit excessive thinning of the wafer at the edges or "edge rolloff" during polishing. This excessive thinning at the edges can lead to unwanted oxide removal on the outer portions of the wafer and a high degree of TTV.

Furthermore, semiconductor-on-insulator (SOI) wafers for many applications also require ultra low TTV's. SOI wafers produced by the bond, etch back, and polish process have an even greater tendency to exhibit an edge roll-off and thinning problem during the polishing process. The increased roll-off problem associated with SOI wafers may be due to lower thermal conductivity of the SOI wafer as compared to ordinary silicon wafers.

Historically, standard chemical mechanical polishing processes employing a conventional wafer backing insert behind the wafer have been used for final wafer polishing. The conventional wafer backing inserts generally have diameters at least equal to the diameter of the wafers being polished and generally have the same diameter as the wafer being polished. These chemical mechanical polishing processes use polishing pads in combination with polishing slurries, which are contacted with a wafer having a wafer backing insert behind it being supported by a wafer backing plate and rotatable spindle.

Conventional wafer backing inserts are generally made of a compressible material having a compressibility of between about 4% and 16%, have a thickness of between about 0.5 and 0.8 millimeters, and have a sufficient number of holes in them to allow air to be drawn from a vacuum before and after the polishing process to allow transport of the wafer between polishing tables and pads. The front side of the wafer backing insert comprises a non-woven matrix-type fabric, polymerized felt-type fabric, or other material suitable for frictionally engaging the back surface of the semiconductor wafer during polishing. The back side of the wafer backing insert comprises an adhesive type material to adhere the backing insert to the wafer backing plate during polishing. Conventional wafer backing inserts such as a DF-200 backing insert are commercially available from R. Howard Strasbaugh Inc. (San Luis Obispo, Calif.). The polishing slurry utilized throughout the polishing process is generally composed of various particle sized silica dispersed in an alkaline water base.

Although chemical mechanical polishing has generally yielded favorable results, it tends to exhibit an enhanced silicon removal rate at the edges of the wafer as the edges experience a combination of the unflexed polish pad fibers and fresh undepleted slurry. This rolloff may lead to a "dish" or "dome" shaping of the wafer, and may be further compounded by non-uniformity in pad conditioning. This wafer edge thinning problem due to deficiencies in the chemical mechanical polishing process is extremely difficult and costly to correct by reworking.

SUMMARY OF THE INVENTION

Among the objects of the present invention, therefore, is a chemomechanical polishing process in which edge rolloff is reduced, the provision of such a process in which extremely flat semiconductor substrates having minimal TTV are produced, and the provision of such a process in which the removal of unwanted oxide at the outer edges of the semiconductor substrate during polishing is minimized.

Briefly, therefore, the present invention is directed to a wafer backing insert for use in a free mount semiconductor polishing apparatus. The wafer backing insert has a diameter less than the diameter of semiconductor substrate being polished to allow the removal of material at the edge of the semiconductor substrate to be less than the overall average removal of material across the semiconductor substrate.

The invention is further directed to a free mount semiconductor polishing apparatus having a polishing table, a polishing pad, a wafer backing plate mounted to a rotatable spindle, a wafer backing insert having a diameter less than the diameter of the semiconductor substrate being polished and being positioned between the wafer backing plate and the semiconductor substrate being polished, a slurry tube for providing slurry upon the polishing pad, an inlet tube for providing deionized water for rinsing the semiconductor substrate, and a semiconductor substrate being positioned between the wafer backing insert and the polishing pad.

The invention is still further directed to a free mount semiconductor polishing process wherein a semiconductor substrate is placed in a free mount polishing apparatus having a wafer backing plate mounted to a rotatable spindle, a wafer backing insert having a diameter less than the diameter of the semiconductor substrate being polished and being positioned between the wafer backing plate and the semiconductor substrate being polished, the semiconductor substrate being positioned between the wafer backing insert and a polishing pad so that the back side of the semiconductor substrate is frictionally engaged with the wafer backing insert, the polishing pad positioned opposite the front side of the semiconductor substrate and being supported by a polishing table and a slurry tube for providing slurry upon the polishing pad, an inlet tube for providing deionized water for rinsing the semiconductor substrate, and rotating the wafer backing insert and semiconductor substrate and polishing pad while injecting slurry and contacting the semiconductor substrate and polishing pad.

The invention is further directed to a free mount semiconductor polishing process wherein a semiconductor substrate is subjected to a two step polishing process wherein the first polishing utilizes a wafer backing insert having a diameter at least equal to the diameter of the semiconductor substrate being polished and the second polishing process utilizes a wafer backing insert having a diameter less than the diameter of the semiconductor substrate being polished.

Other objects and features of this invention will be in part apparent and in part pointed out hereinafter.

BRIEF DESCRIPTION OF THE DRAWINGS

Corresponding reference characters indicate corresponding parts throughout the drawings.

DETAILED DESCRIPTION OF THE PREFERRED EMBODIMENTS

In accordance with the present invention, it has been discovered that the amount of material removed at the outer edges of a semiconductor substrate during the polishing process can be lessened by reducing the diameter of the wafer backing insert relative to the diameter of the semiconductor substrate being polished. When the wafer backing insert has a diameter less than the diameter of the semiconductor substrate being polished, the substrate flexes away from the polishing pad at the edges unsupported by the wafer backing insert during the polishing process which, in turn, leads to less material removal at the edges of the substrate. Moving radially inward from the edge, the extent of material removal increases until the position where the insert fully supports the substrate is reached; between this position and the center of the substrate, the material removal is substantially uniform.

Figure 1:
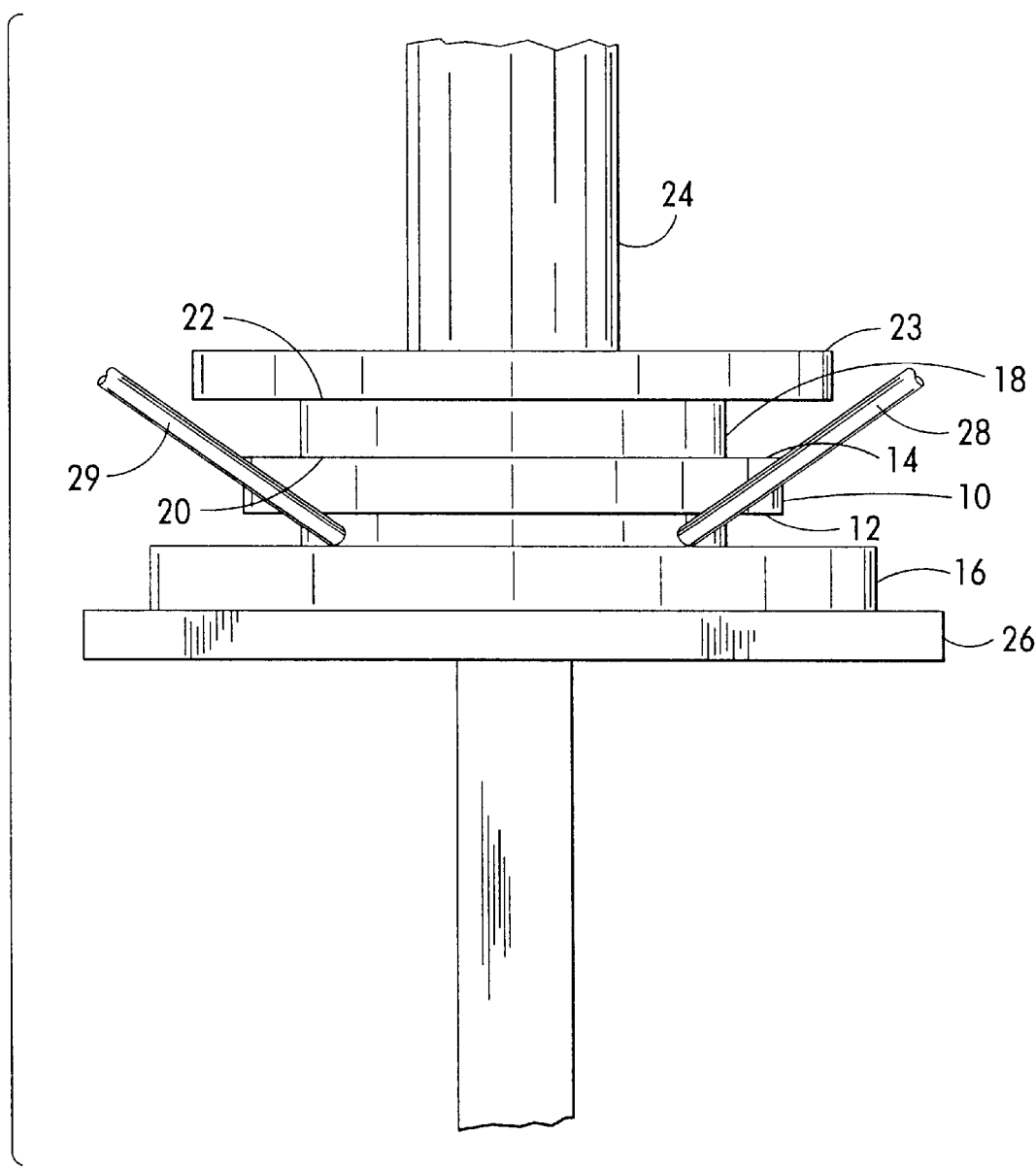
FIG. 1 is a schematic diagram of a free mount semiconductor polishing apparatus.

Referring now to FIG. 1, there is shown a semiconductor substrate 10 having a front surface 12 and a back surface 14 being positioned between polishing pad 16 and wafer backing insert 18 with the front surface 12 of semiconductor substrate 10 facing polishing pad 16 and the back surface 14 facing wafer backing insert 18. Polishing pad 16 is positioned on polishing table 26. Wafer backing insert 18 has a front surface 20 and a back surface 22 facing wafer backing plate 23. Wafer backing plate 23 is mounted on spindle 24 and is positioned between wafer backing insert 18 and spindle 24, and may have a plurality of holes to allow for the passage of air. A slurry tube 28 provides a source of polishing slurries into the polishing process, and an inlet tube 29 provides deionized water for rinsing the wafer.

Wafer backing insert 18 has a front surface 20 and a back surface 22 and is similar to a conventional backing insert as previously described. Polishing pad 16 is a conventional stock removal or final finish pad such as a "SUBA IV" or a "UR 100," pad sold by Rodel Pads Inc. (Newark, Del.).

Polishing table 26 supports polishing pad 16, and is capable of rotation. Spindle 24 is rotatable and comprised of stainless steel or any other suitable surface for rotating semiconductor substrate 10, wafer backing plate 23, and wafer backing insert 18 during the polishing process.

During the polishing process, semiconductor substrate 10, wafer backing insert 18, and wafer backing plate 23 are rotated by spindle 24 at a rate of between about 15 and about 150 rpm, preferably between about 20 and about 100 rpm. Spindle 24 is capable of applying downward force onto polishing table 26 of between about 1 psi (about 0.07 kg/m$^2$) and about 10 psi (about 0.7 kg/m$^2$), preferably about 2.5 psi (about 0.18 kg/m$^2$) to facilitate polishing.

Semiconductor substrate 10 can have a diameter of 125 mm, 150 mm, 200 mm, 300 mm, or any other size suitable for polishing. In general, wafer backing insert 18 has a diameter which is at least 2% less than semiconductor substrate 10, preferably between about 2% and about 5% less than semiconductor substrate 10, and most preferably about 3% less than semiconductor substrate 10. In general, the percentage difference between the diameter of the insert and the diameter of the substrate is a function of the thickness of the substrate being polished, with the difference between the two increasing as the thickness of the substrate increases. Preferably, wafer backing insert 18 is shaped appropriately to maintain a reduced material removal rate at primary and secondary fiducials. Polishing pad 16 is rotated by polishing table 26 in the same direction as semiconductor substrate 10 wafer backing insert 18 and wafer backing plate 23 at between about 20 to 150 rpm, preferably about 40 rpm.

As polishing pad 16 and semiconductor substrate 10 come into contact, polishing slurry is provided through slurry tube 28 which is connected to one or more polishing slurry tanks (not shown) containing polishing slurry. More than one slurry tube may by utilized to provide one or more polishing slurries onto the polishing pad simultaneously. Alternatively, the slurry tube may be coupled to a plurality of polishing slurry lines to provide a mixture of slurries onto the polishing pad. One or more polishing slurries may alternatively be mixed together in a mixing tank prior to being provided onto the polishing pad through the slurry tube.

Once the polishing slurry is introduced onto the polishing pad, the rotating polishing pad rubs the slurry against the semiconductor wafer to polish the wafer. One or more polishing slurries such as "SYTON HT-50" available from Remet, Inc. (Chadwicks, N.Y.) or "GLANZOX" available from Fujimi, Inc. (Elmhurst, Ill.) may be utilized. After sufficient polishing, the polishing is discontinued, and semiconductor substrate 10 is rinsed with deionized water which is provided through inlet tube 29 which is connected to a deionized water source (not shown). Optionally, the semiconductor substrates may be rinsed with deionized water provided through inlet tube 29 throughout the polishing process.

Figure 2:
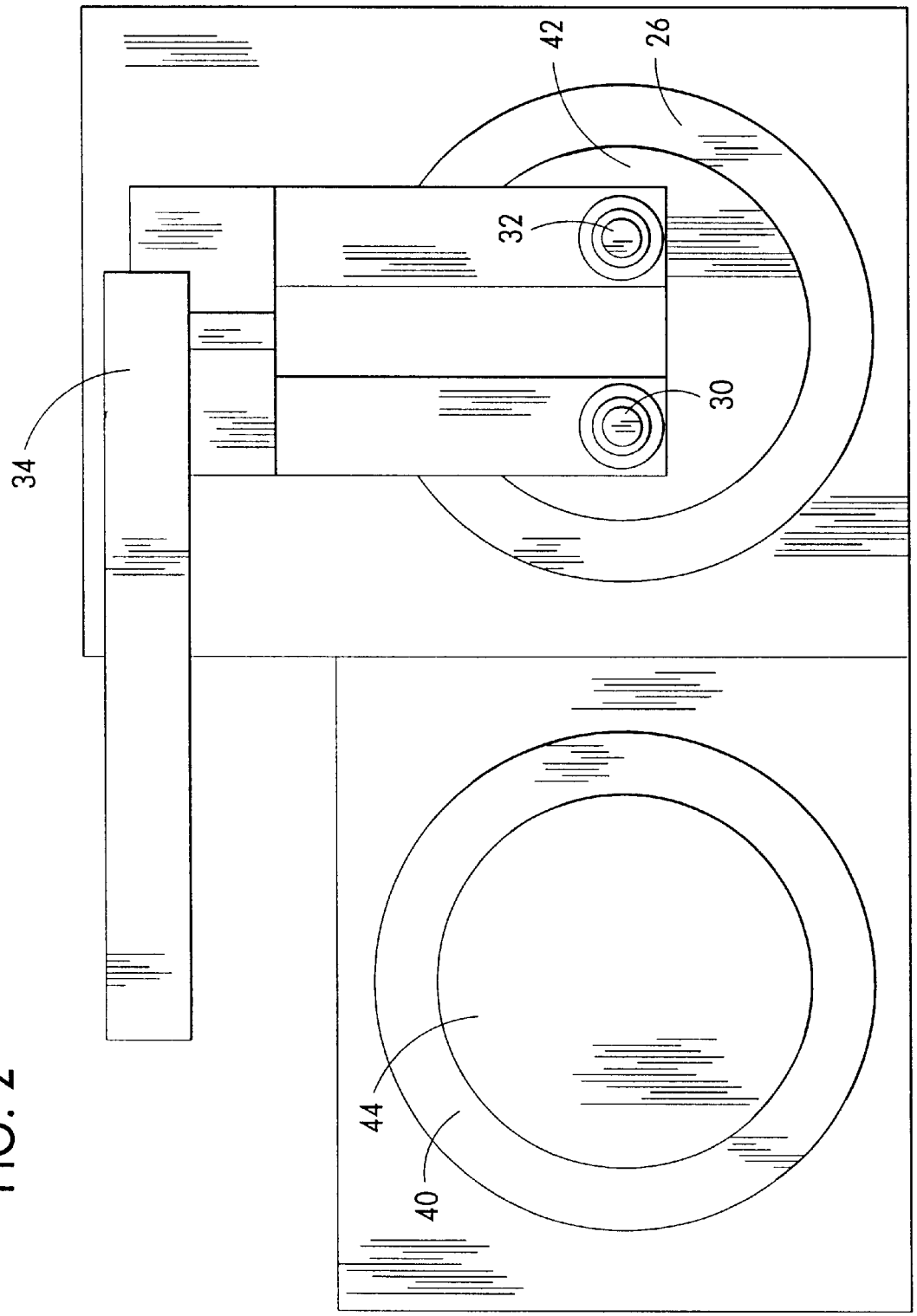
FIG. 2 is a schematic diagram of a wafer polishing apparatus having two polishing tables.

In order to increase overall throughput of the substrate polishing process, two or more semiconductor substrates may be polished simultaneously on the same polishing table. In FIG. 2, there is shown a polishing table 26 capable of rotating on a polishing table axis being positioned underneath a polishing pad 42, a left spindle 30 and a right spindle 32. Both left spindle 30 and right spindle 32 hold a single semiconductor substrate for polishing on polishing table 26. This type of polishing apparatus, such as a Model 6DS-SP, is commercially available through R. Howard Strasbaugh, Inc. (San Luis Obispo, Calif.).

Optionally, to increase throughput the polishing apparatus may be equipped with an additional polishing table capable of supporting a second stock removal or final finishing pad. Referring again to FIG. 2, there is shown a second polishing table 40 capable of rotating on a polishing table axis and capable of supporting a second polishing pad 44. Both left spindle 30 and right spindle 32 can be moved from the first polishing table 26 by a bridge assembly 34 so as to be positioned above the second polishing table 40.

The resulting polished semiconductor substrate exhibits a TTV of between about 0.2 and about 2.5 microns, preferably between about 0.2 and about 1.5 microns. The total material stock removal across the substrate is between about 2 to about 12 microns, preferably between about 2 to about 5 microns.

Figure 4:
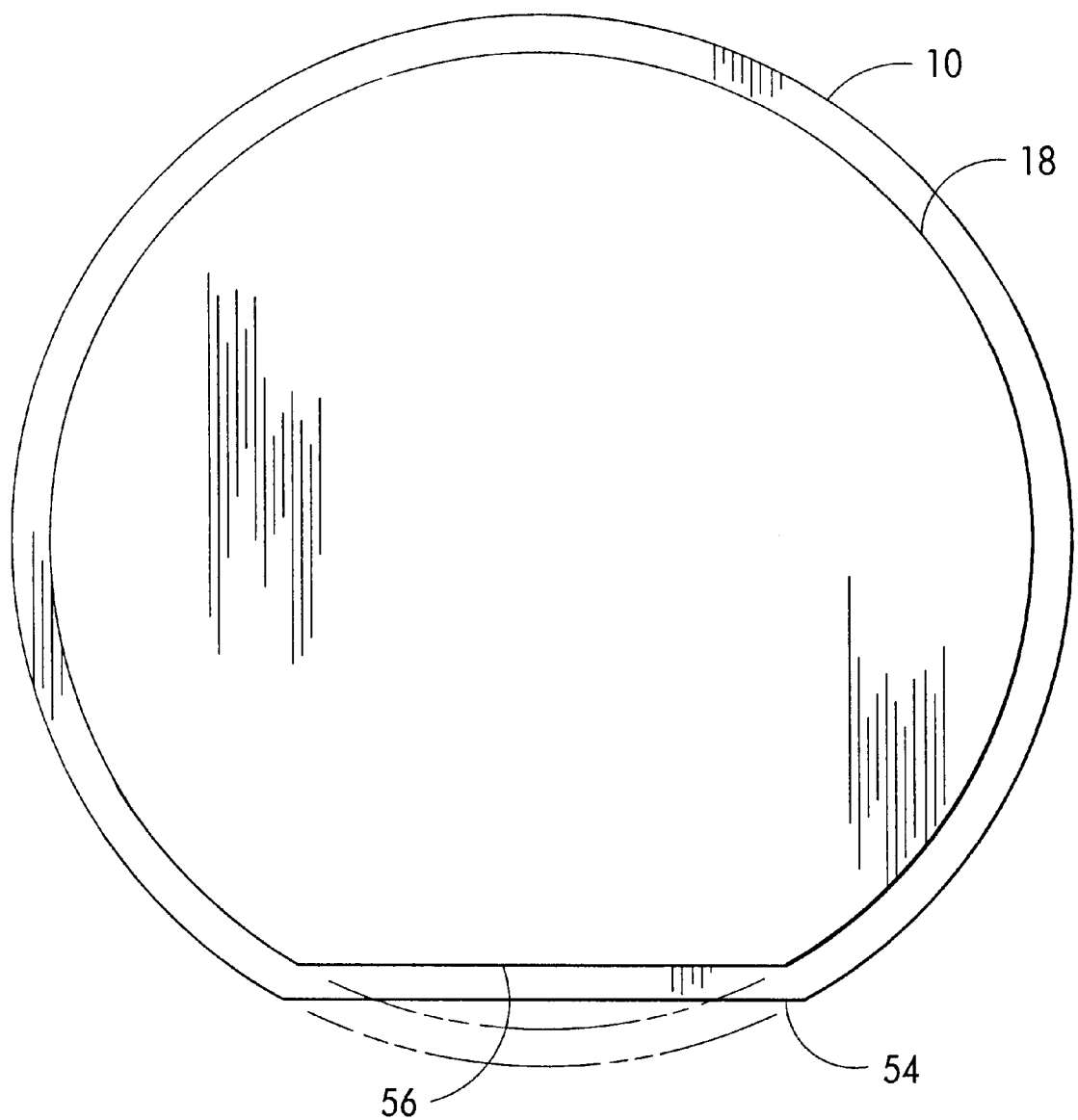
FIG. 4 is a diagram of the relative sizes and relationship between a wafer backing insert of the present invention and a 150 mm semiconductor wafer.

FIG. 4 shows wafer backing insert 18 overlaying semiconductor substrate 10 with a primary fiducial 56 of wafer backing insert 18 aligned in generally parallel relationship with a primary fiducial 54 of semiconductor substrate 10. Backing insert 18 is sized substantially smaller than the corresponding semiconductor substrate 10 such that the edge margin of the wafer backing insert 18 is constantly spaced radially inward from the edge margin of substrate 10. For example, the wafer backing insert 18 of FIG. 4 may have a diameter of about 146 mm, and a diameter of about 140 mm at the primary fiducial, while the substrate 10 may have a diameter of about 150 mm and a diameter at the primary fiducial of about 144 mm.

Figure 3:
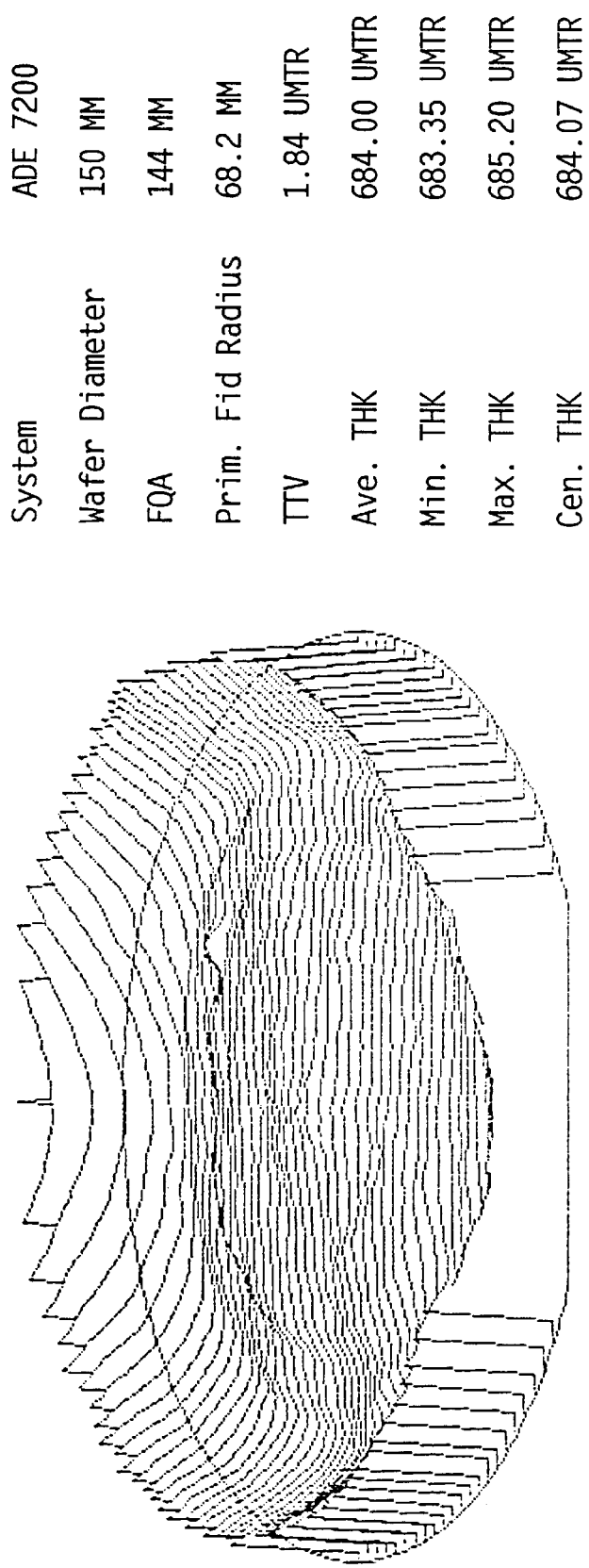
FIG. 3 is a wafer thickness profile for a 150 mm semiconductor wafer polished using a wafer backing insert of the present invention.

FIG. 3 shows a thickness profile for a wafer having a diameter of 150 mm and a primary fiduciary radius (the distance from the wafer center to the center of the primary flat) of about 68.2 mm. The wafer was polished according to the present invention utilizing a wafer backing insert having a diameter of 146 mm, and a diameter of 140 mm at the primary fiducial. The thickness profile was performed on an ADE Series 7200 Wafer Measurement System.

Referring again to FIG. 3 it is shown that the resulting TTV for the wafer was 1.84 microns. This TTV was determined based on a Flatness Quality Area (FQA, or the area of the wafer actually examined) of 144 mm. Generally the outer 3 mm around the entire substrate is not examined for TTV as this parameter is not critical in this area. Resulting TTV on this outer portion of the substrate is not critical as the outer portion is generally not used to fabricate individual devices, but is the area of the substrate handled throughout the processing. However, it should be recognized that this invention is not limited to only improving the resulting TTV across the semiconductor substrate until the outer 3 mm of the substrate is reached. The wafer backing insert of the present invention could be easily modified by one skilled in the art to improve resulting TTV across the entire substrate surface, including the outermost 3 mm around the edges of the substrate surface.

Also shown in FIG. 3 is the minimum and maximum thickness of the wafer, along with the average thickness across the wafer and the thickness in the center of the wafer. These thickness values can be used in conjunction with corresponding values determined on a wafer before any polishing to determine the amount of silicon removed across the wafer surface.

FIG. 3 indicates that more silicon was removed from the center portion of the wafer than from the outer edges of the wafer as the outer edges are significantly thicker than the center regions.

In a preferred embodiment of the invention, the polishing process of the present invention is used in combination with a first polishing step in which a wafer backing insert having a diameter which is at least equal to the diameter of the substrate being polished is used. The entire polishing process is thus divided into two polishing steps to control target wafer thickness and TTV, and to increase total throughput. The first polishing step, utilizing a conventional wafer backing insert, leads to excessive substrate thinning on the edge of the substrate, or edge rolloff. The second polishing step, utilizing the wafer backing insert of the present invention, compensates for the edge rolloff and produces a final substrate with good overall TTV and uniform thickness across the entire substrate. The resulting TTV for substrates polished using this preferred two step process is between about 0.2 and about 2 microns, preferably between about 0.5 and about 1.5 microns.

Figure 5:
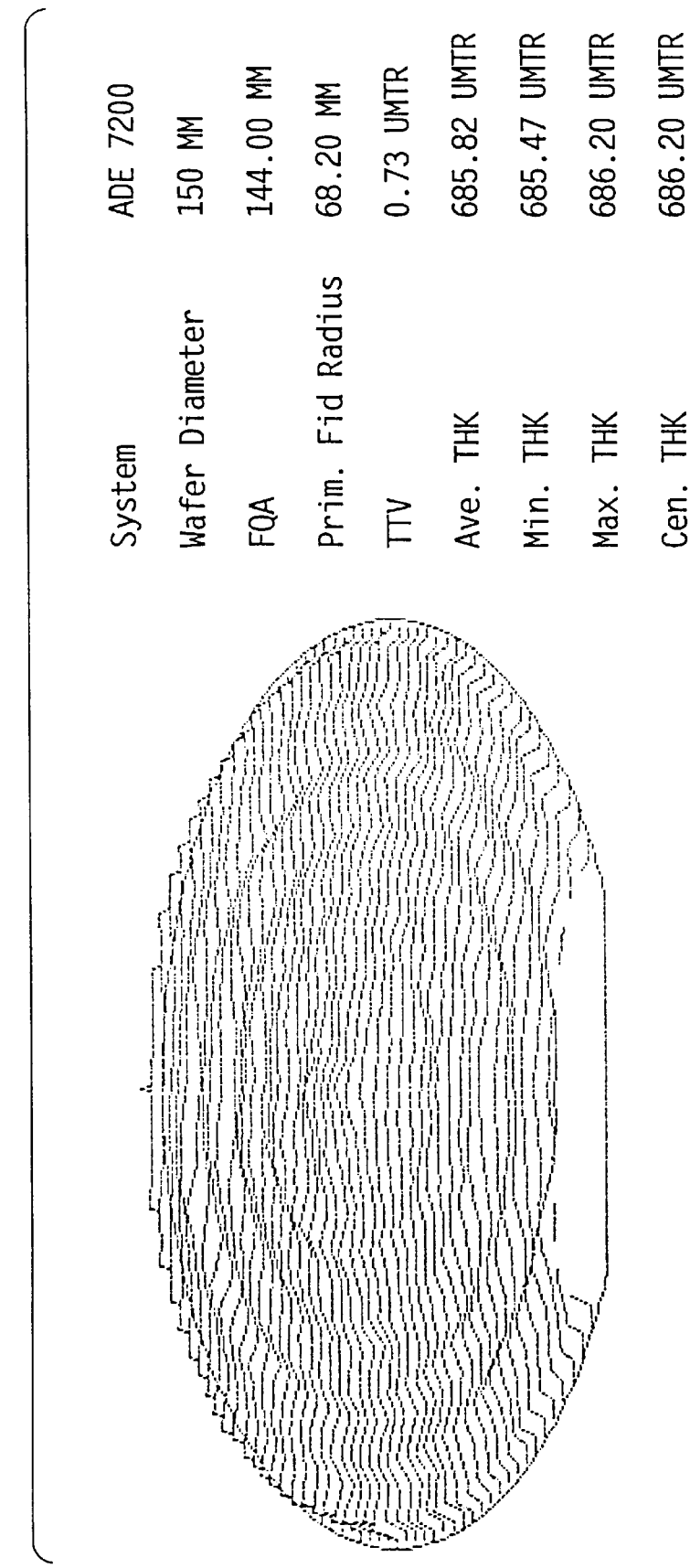
FIG. 5 is a wafer thickness profile for a 150 mm semiconductor wafer prior to polishing.

FIG. 5 shows a 150 mm semiconductor wafer prior to any polishing. It is shown that the wafer is very flat, exhibits a low TTV of 0.73 microns, and has no thinness or thickness at the outer edges.

In the preferred embodiment, the first polishing step uses a standard wafer backing insert having a diameter at least equal to the diameter of the semiconductor substrate being polished and removes between about 5 and about 12 microns, preferably about 10 microns, of silicon across the entire substrate. As discussed above, this standard procedure removes more material at the edges of the substrate due to "edge-rolloff."

Figure 6:
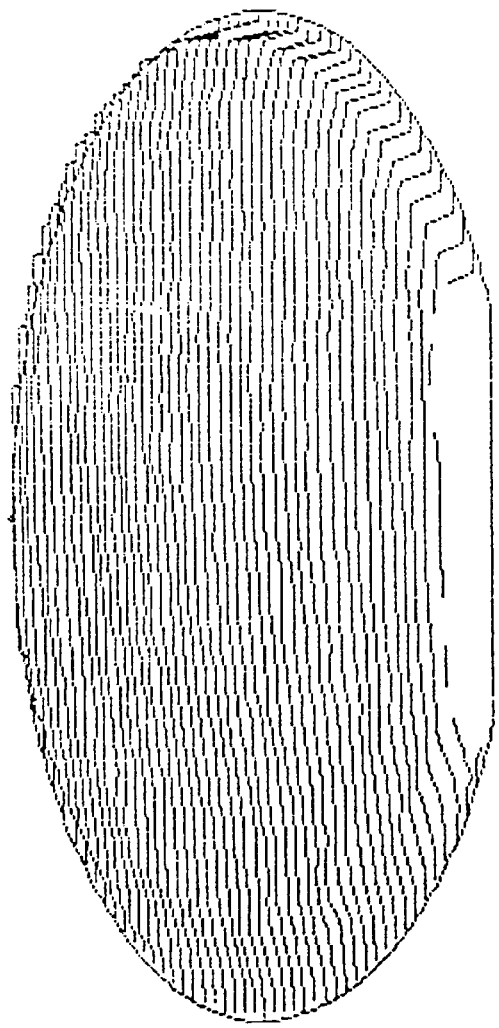
FIG. 6 is a wafer thickness profile for a 150 mm semiconductor wafer polished with a process utilizing a conventional wafer backing insert.

FIG. 6 shows a 150 mm semiconductor wafer after polishing according to the first polishing step utilizing a wafer backing insert with a diameter of 150 mm, with the appropriate cut out for the primary fiducial. The resulting TTV for this wafer was 1.23 microns for an FQA of 144 mm. Edge roll off is shown as the outer portion of the wafer has had an increased amount of silicon removed as compared to the central region of the wafer.

The second polishing step utilizes the wafer backing insert of the present invention described above and compensates for the "edge-rolloff" problem due to the first polishing step by removing between about 3 to about 5 microns, preferably about 3 microns of material in the central region of the substrate, and only between about 2 to about 3, preferably about 2.5 microns of material at the substrate edge. Because less material is removed at the edge of the substrate, the combination of polishing step 1 and polishing step 2 results in minimal TTV across the entire substrate.

Figure 7:
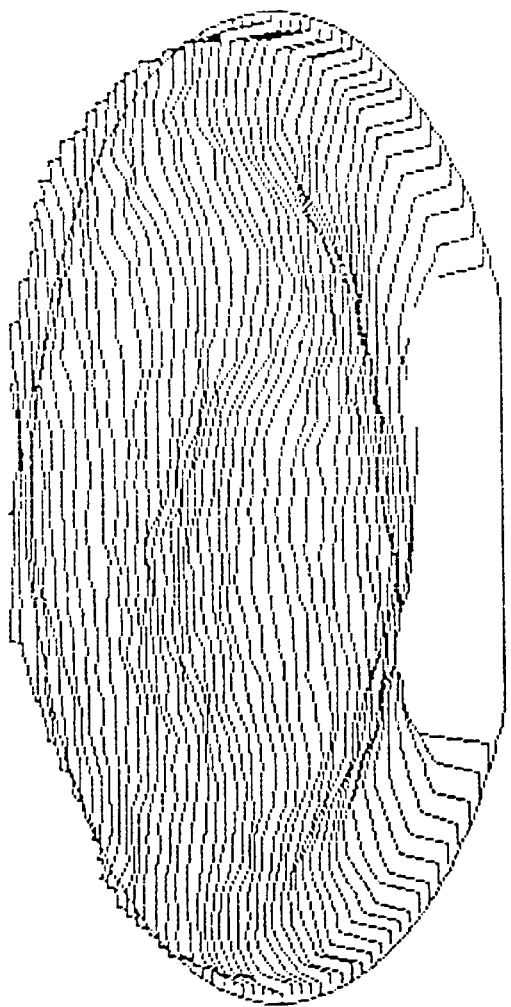
FIG. 7 is a wafer thickness profile for a 150 mm semiconductor wafer polished using the preferred two step polishing process of the present invention.

FIG. 7 shows a wafer that has been polished using the above-described two step polishing process incorporating a wafer backing insert with a diameter of 146 mm in the second polishing process. The resulting TTV of this wafer was 1.07 microns. It is shown that the resulting wafer does not exhibit the edge rolloff problem customary with the use of conventional wafer backing insert only processes.

It should be recognized that the wafer backing insert of the present invention can be used to polish silicon wafers, semiconductor-on-insulator substrates such as silicon-on-insulator substrates, and other semiconductor substrates. The present invention is illustrated by the following example which is merely for the purpose of illustration and is not to be regarded as limiting the scope of the invention or manner in which it may be practiced.

EXAMPLE

Figure 8:
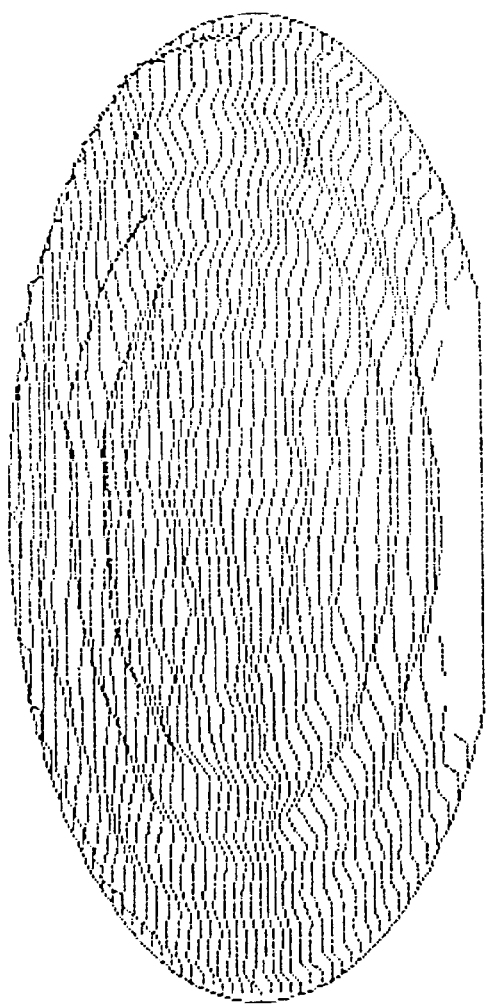
FIGS. 8, 9, 10 are wafer thickness profiles for 3 different 150 mm semiconductor wafers prior to polishing.
Figure 9:
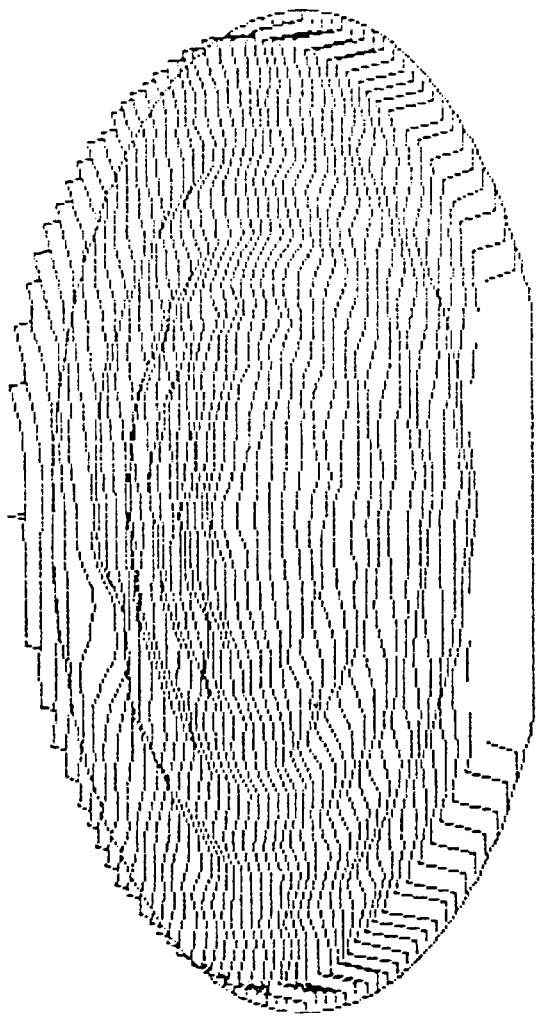
Figure 10:
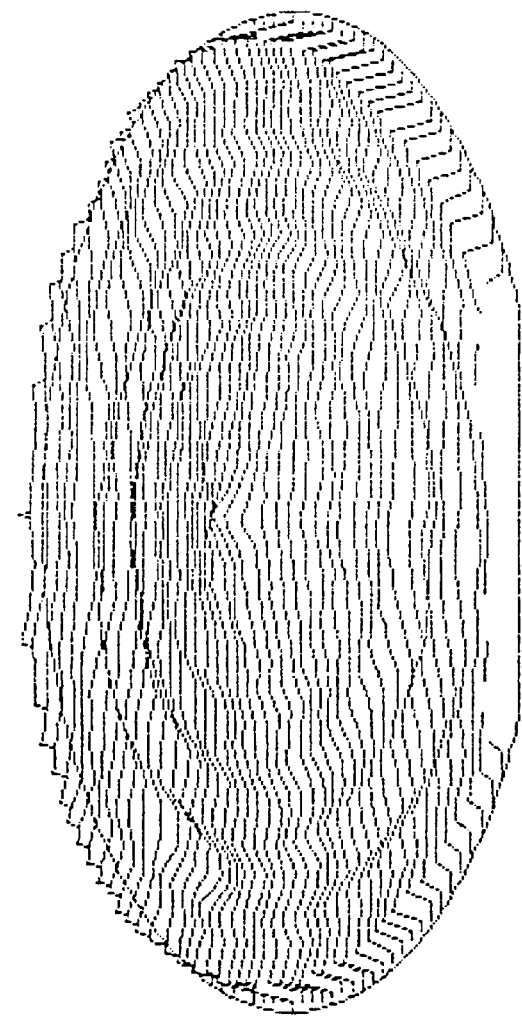

Three 150 mm semiconductor wafers, a, b, and c, were polished using the preferred two step polishing process of the present invention. FIGS. 8, 9, and 10 show thickness profiles for a, b, and c respectively prior to the first polishing step. It is shown that the wafers have TTV values of 0.56, 1.09, and 0.95 microns respectively and are generally flat across their surfaces, and exhibit no edge roll off prior to polishing. The average thicknesses across the wafers a, b, and c prior to any polishing are 686.00, 687.88, and 687.57 microns respectively.

Figure 11:
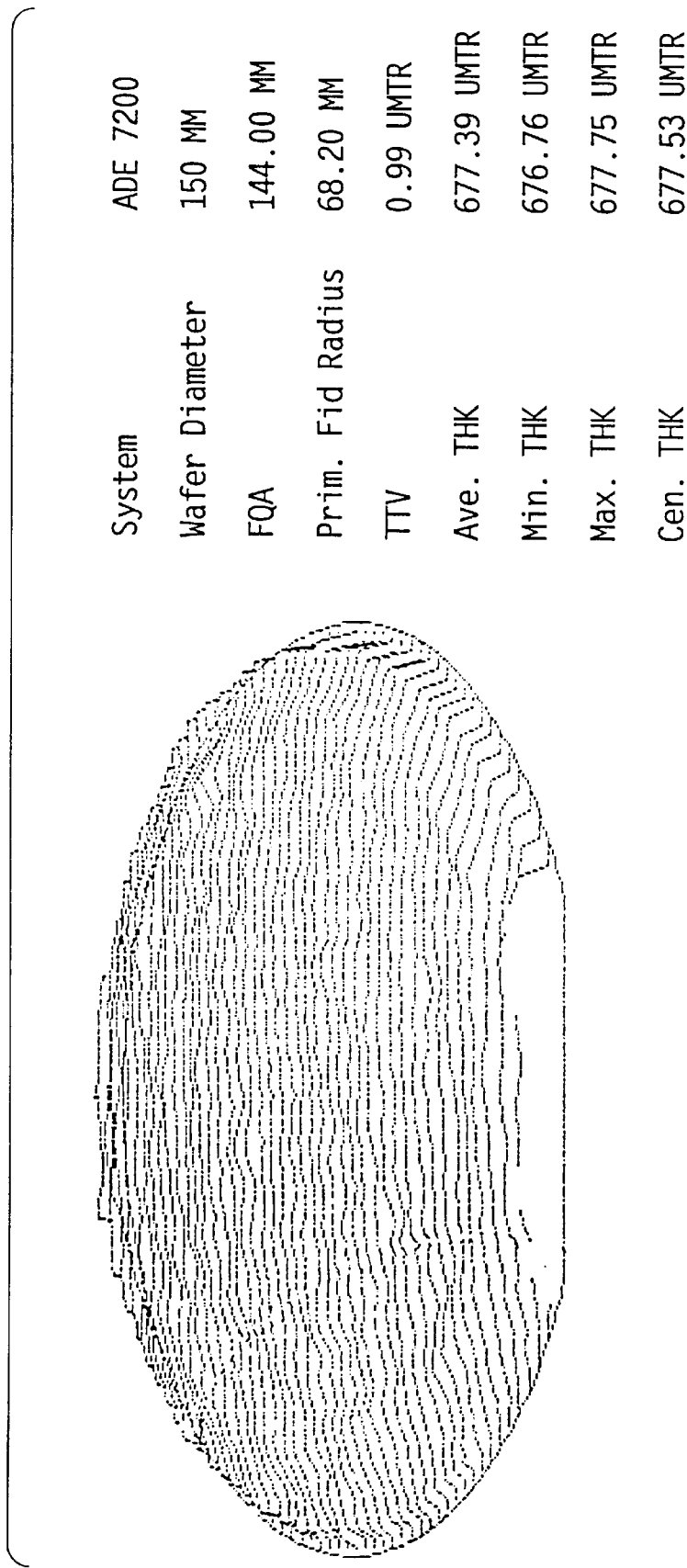
FIGS. 11, 12, 13 are wafer thickness profiles for 3 different 150 mm semiconductor wafers after a polishing process utilizing a conventional wafer backing insert.
Figure 12:
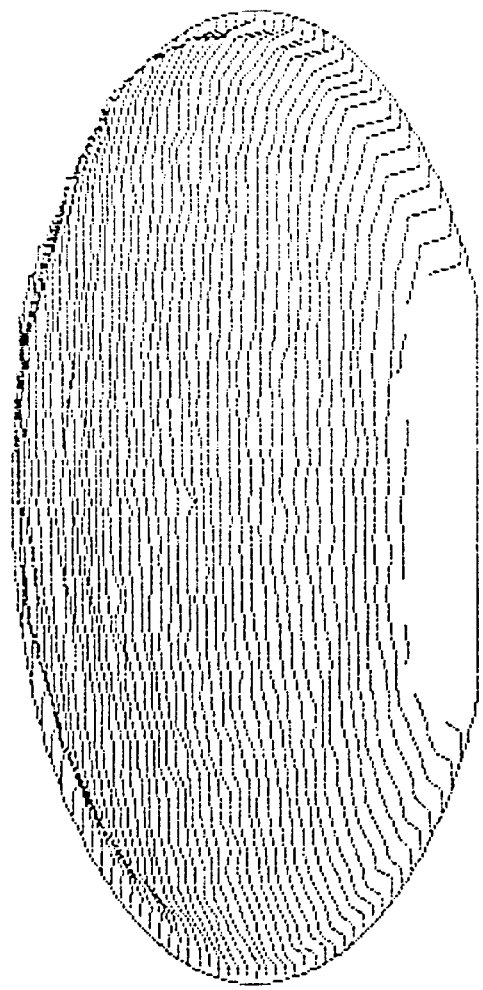
Figure 13:
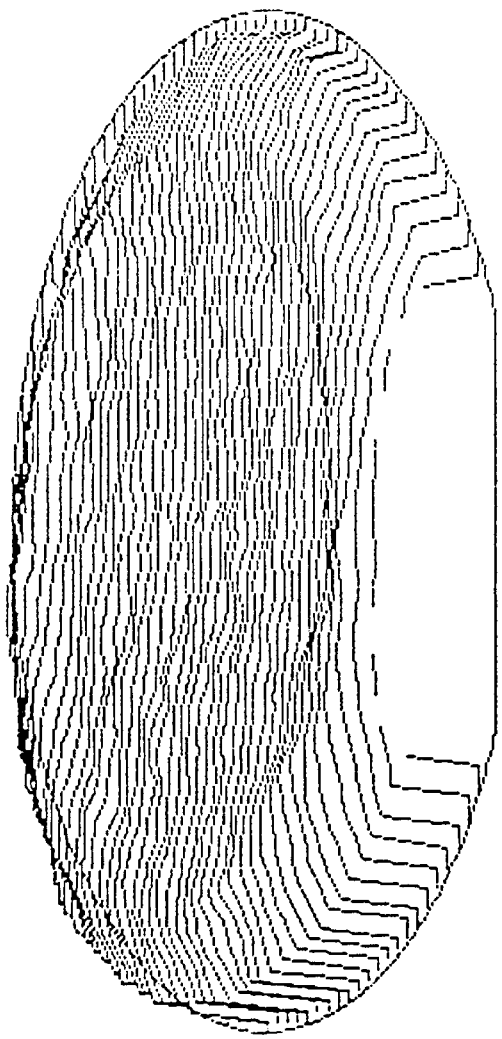

The three semiconductor wafers were first polished using a process incorporating a conventional wafer backing insert having a diameter of 150 mm. The process parameters for the first polishing step to remove a target value of about 10 microns of silicon across the entire wafer are shown in Table I.

step were 0.99, 0.97, and 1.4 microns. The amount of silicon removed across the wafer (the difference between the average thickness before and after polishing) was 8.61, 10.13, and 7.77 microns respectively. All three wafers showed severe wafer thinning on the outer portion of the wafer due to edge rolloff. This is indicated in FIGS. 11, 12, and 13 by the thinning of the wafers toward the outermost portion of the wafer.

After the first polishing step, the wafers were subjected to a second and final polishing step wherein a wafer backing insert having a diameter of 145 mm was incorporated with

TABLE I

| Wafer backing plate | = 152 MM (147 Holes) |
|---|---|
| Rough Table Pad | = SB-850, PSA, II (29", 50 MILS) |
| Finish Table Pad | = UR-100 PSA, II (24") |
| Wafer Backing Insert | = 150 mm (Compressibility = 16%) |
| Rough Slurry #1 | = Sodium Stabilized Colloidal Silica Slurry in an Alkaline Etchant |
| Rough/Finish Slurry #2 | = Ammonia Stabilized Colloidal Silica Slurry |
| Rough/Finish Slurry #2A | = Acidic Quench Solution |
| Scaling Factor (Left/Right) | = 100.9%/100.0% |
| Rough Table Neslab Temperature | = 60° C. |

| PROCESS STEP | TABLE I STEP #01 | TABLE I STEP #02 | TABLE I STEP #03 | TABLE I STEP #04 | TABLE II STEP #11 | TABLE II STEP #12 | TABLE II STEP #13 |
|---|---|---|---|---|---|---|---|
| Polishing Time, Sec | 10 | 610 | 45 | 20 | 15 | 90 | 30 |
| Polish Force, Psi | 2.3 | 6.2 | 2.5 | 2.5 | 2.5 | 2.5 | 2.5 |
| Force Pressure Ramp, Sec | 0 | 30 | 0 | 0 | 0 | 0 | 0 |
| Spindle Speed, RPM | 35 | 35 | 35 | 10 | 100 | 100 | 100 |
| Table Speed, RPM | 40 | 40 | 40 | 10 | 100 | 100 | 100 |
| Slurry #1 Flow Rate, Ml/Min | 575 | 575 | 0 | 0 | 0 | 0 | 0 |
| Slurry #2 Flow Rate, Ml/Min | 0 | 0 | 70 | 0 | 70 | 70 | 0 |
| Slurry #2A Flow Rate, Ml/Min | 0 | 0 | 0 | 600 | 0 | 0 | 600 |
| DI H2O Rinse Flow Rate, Ml/Min | OFF | OFF | ON (630) | ON (630) | ON (630) | ON (630) | ON (630) |

As Table I indicates, the polishing machine employed in the first polishing step utilized two polishing tables, the first incorporating a rough table pad to remove most of the target 10 microns, and a finish table pad to remove a lesser amount of silicon. FIGS. 11, 12, and 13 correspond to wafers a, b, and c respectively, and show thickness profiles for the three wafers, and indicate that the TTVs after the first polishing the appropriate modification for the primary fiducial. The process parameters for the second polishing process to remove about 3 microns across the center of the wafer and about 2.5 at the edges are shown in Table II.

TABLE II

| Wafer backing plate | = 152 MM (147 Holes) |
|---|---|
| Rough Table Pad | = SB-850, PSA, II (29", 50 MILS) |
| Finish Table Pad | = UR-100 PSA, II (24") |
| Wafer Backing Insert | = 145 mm Compressibility = 16% |
| Rough Slurry #1 | = Sodium Stabilized Colloidal Silica Slurry in Alkaline Etchant |
| Rough/Finish Slurry #2 | = Ammonia Stabilized Colloidal Silica Slurry |
| Rough/Finish Slurry #2A | = Acidic Quench Solution |
| Rough Table Neslab Temperature | = 60° C. |

| PROCESS STEP | TABLE I STEP #01 | TABLE I STEP #02 | TABLE I STEP #03 | TABLE I STEP #04 | TABLE II STEP #11 | TABLE II STEP #12 | TABLE II STEP #13 |
|---|---|---|---|---|---|---|---|
| Polishing Time, Sec | 10 | 175 | 20 | 20 | 15 | 90 | 30 |
| Polish Force, Psi | 2.5 | 6.2 | 2.5 | 2.5 | 2.5 | 2.5 | 2.5 |
| Force Pressure Ramp, Sec | 0 | 30 | 0 | 0 | 0 | 0 | 0 |
| Spindle Speed, RPM | 35 | 35 | 35 | 35 | 35 | 35 | 35 |
| Table Speed, RPM | 40 | 40 | 40 | 40 | 40 | 40 | 40 |
| Slurry #1 Flow Rate, Ml/Min | 575 | 575 | 0 | 0 | 0 | 0 | 0 |
| Slurry #2 Flow Rate, Ml/Min | 0 | 0 | 70 | 0 | 70 | 70 | 0 |
| Slurry #2A Flow Rate, Ml/Min | 0 | 0 | 0 | 600 | 0 | 0 | 600 |
| DI H2O Rinse Flow Rate, Ml/Min | OFF | OFF | ON (630) | ON (630) | ON (630) | ON (630) | ON (630) |

Figure 14:
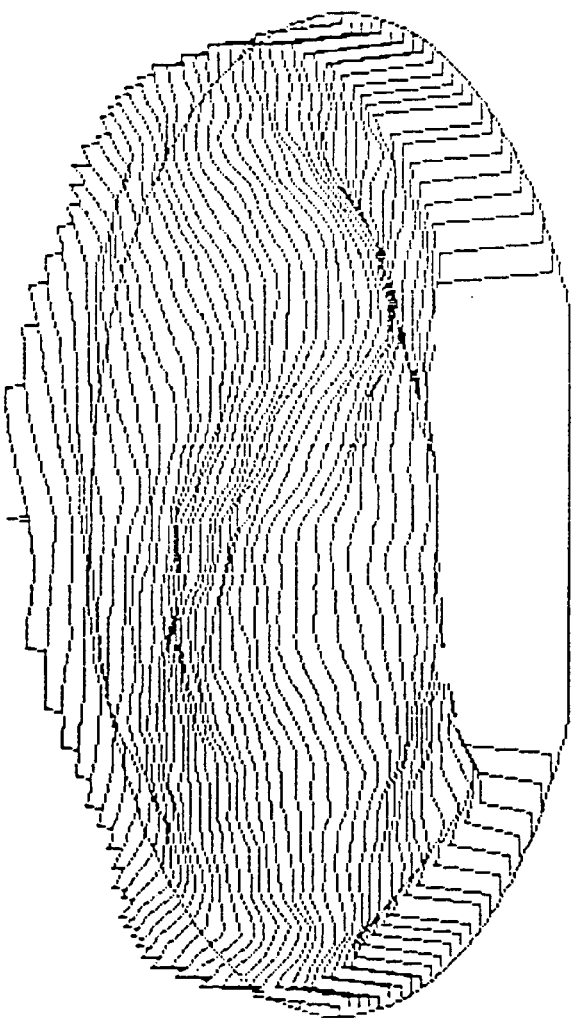
FIGS. 14, 15, 16 are wafer thickness profiles for 3 different 150 mm semiconductor wafers after a polishing process utilizing the two step preferred process of the present invention.
Figure 15:
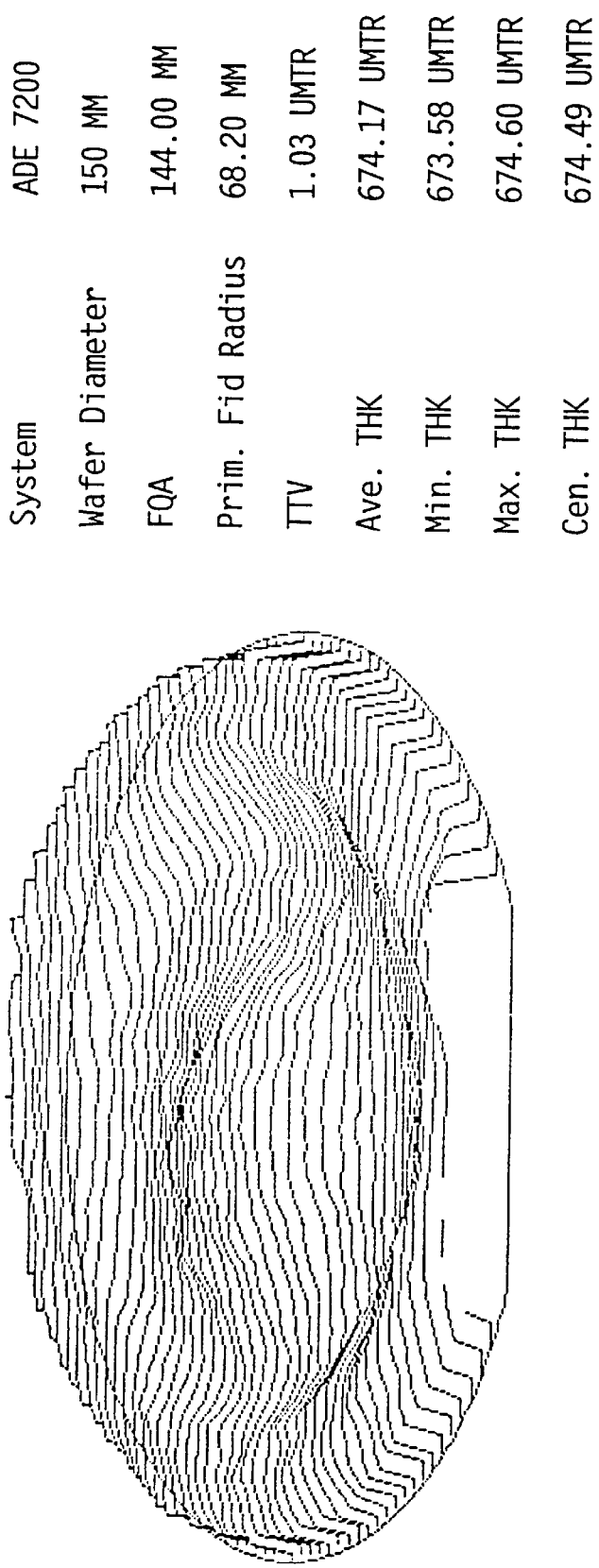
Figure 16:
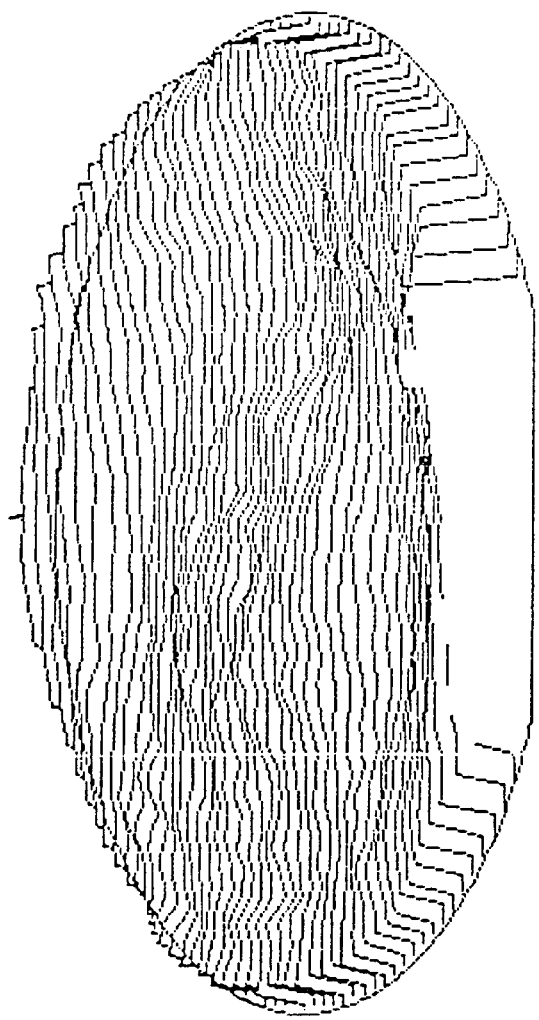

As Table II indicates, the polishing machine employed in the second polishing step also utilized two polishing tables, the first incorporating a rough table pad to remove most of the target 3 microns in the center of the wafer, and a finish table pad to remove a lesser amount of silicon. FIGS. 14, 15, and 16 correspond to wafers a, b, and c respectively, and show thickness profiles for the three wafers, and indicate that the final TTVs after the second and final polishing were 1.49, 1.03, and 1.51 microns. The amount of silicon removed across the wafer throughout both polishing steps was 12.25, 13.71, and 13.42 microns respectively. FIGS. 14, 15, and 16 indicate that the edge rolloff has been substantially eliminated and the resulting wafer from the two step polishing process is smooth across the entire wafer and exhibits low TTV values.

In view of the above, it will be seen that the several objects of the invention are achieved.

As various changes could be made in the above-described processes without departing from the scope of the invention, it is intended that all matter contained in the above description be interpreted as illustrative and not in a limiting sense.

What is claimed is:

1. A process for preparing a semiconductor substrate for polishing, the process comprising:

placing the substrate in a free mount polishing apparatus, the apparatus comprising a spindle capable of rotation about a spindle axis, a wafer backing plate positioned on the spindle, a wafer backing insert having a diameter between about 2% and about 5% less than the diameter of the semiconductor substrate being polished positioned between the wafer backing plate and the substrate, said substrate being positioned on the wafer backing insert such that the back side of the substrate is frictionally engaged with the wafer backing insert, a polishing pad positioned opposite the front side of the substrate and being supported by a polishing table capable of rotation about a polishing table axis, a slurry tube for providing slurry upon the polishing pad, and an inlet tube for providing deionized water to rinse the substrate.

2. A process as set forth in claim 1 wherein the semiconductor substrate is a silicon wafer.

3. A process as set forth in claim 1 wherein the semiconductor substrate is a semiconductor-on-insulator substrate.

4. A free mount semiconductor polishing process for polishing a semiconductor substrate having front and back surfaces, the process comprising:

placing the substrate in a free mount polishing apparatus comprising a spindle capable of rotation about a spindle axis, a wafer backing plate being positioned on the spindle, a wafer backing insert having a diameter between about 2% and about 5% less than the diameter of the semiconductor substrate being polished positioned between the wafer backing plate and the substrate, said substrate positioned on the wafer backing insert such that the back side of the substrate is frictionally engaged with the wafer backing insert, a polishing pad positioned opposite the front side of the wafer supported by a polishing table capable of rotation about a polishing table axis, a slurry tube for providing slurry upon the polishing pad, and an inlet tube for providing deionized water to rinse the substrate;

rotating said spindle, said wafer backing plate and said frictionally engaged wafer backing insert and substrate;

rotating said polishing pad; and contacting said rotating wafer backing insert and substrate with said rotating polishing pad.

5. A process as set forth in claim 4 wherein the semiconductor substrate is a silicon wafer.

6. A process as set forth in claim 4 wherein the semiconductor substrate is a semiconductor-on-insulator substrate.

7. A process as set forth in claim 4 wherein the resulting total thickness variation of the substrate is between about 0.2 and about 2.5 microns.

8. A process as set forth in claim 4 wherein the resulting total thickness variation of the substrate is about 1 micron.

9. A process as set forth in claim 4 wherein the total material removal from the substrate is between about 2 to about 12 microns.

10. A process as set forth in claim 4 wherein the wafer backing insert has a diameter of between about 3% and about 5% less than the diameter of the substrate being polished.

11. A process as set forth in claim 4 wherein the substrate has a diameter selected from the group consisting of 125 mm, 150 mm, 200 mm, and 300 mm.

12. The process as set forth in claim 4 wherein said free mount polishing apparatus is a second free mount polishing apparatus, and said step of placing the substrate in the second free mount polishing apparatus is preceded by the steps of:

placing the substrate in a first free mount polishing apparatus comprising a spindle capable of rotation about a spindle axis, a wafer backing plate mounted on the spindle, a wafer backing insert having a diameter at least equal to the diameter of the substrate being polished positioned between the wafer backing plate and the substrate, said substrate being positioned on the wafer backing insert such that the back side of the substrate is frictionally engaged with the wafer backing insert, a polishing pad positioned opposite the front side of the wafer supported by a polishing table capable of rotation about a polishing table axis, a slurry tube for providing slurry upon the polishing pad, and an inlet tube for providing deionized water to rinse the substrate;

rotating said spindle, said wafer backing plate and said frictionally engaged wafer backing insert and substrate;

rotating said polishing table and polishing pad; and contacting said rotating wafer backing insert and substrate with said rotating polishing pad.

13. A process as set forth in claim 12 wherein the semiconductor substrate is a silicon wafer.

14. A process as set forth in claim 12 wherein the semiconductor substrate is a semiconductor-on-insulator substrate.

15. The process as set forth in claim 12 wherein the first polishing apparatus removes between about 5 and about 15 microns of material across the surface of the substrate and the second polishing apparatus removes between about 1 to about 4 microns of material in the central region of the substrate and between about 1 to about 3 microns of material at the substrate edge.

16. The process as set forth in claim 12 wherein the resulting total thickness variation of the substrate is between about 0.2 and about 2.0 microns.

17. A process as set forth in claim 12 wherein the resulting total thickness variation of the substrate is about 1 micron.

18. A process as set forth in claim 12 wherein the total material removal from the substrate is between about 10 to about 20 microns.

19. A process as set forth in claim 12 wherein the total material removal from the substrate is about 12 microns.

20. A process as set forth in claim 12 wherein the wafer backing insert of the second polishing apparatus has a diameter of between about 3% and about 5% less than the diameter of the substrate being polished.

21. A process as set forth in claim 12 wherein the wafer backing insert of the second polishing apparatus has a diameter of about 3% less than the diameter of the substrate being polished.

22. A process as set forth in claim 12 wherein the substrate has a diameter selected from the group consisting of 125 mm, 150 mm, 200 mm, and 300 mm.

* * * * *